United States Patent [19]
Harper

[11] Patent Number: 5,809,449
[45] Date of Patent: Sep. 15, 1998

[54] INDICATOR OF BATTERY CURRENT FOR PORTABLE DEVICES

[75] Inventor: Steven L. Harper, Corvallis, Oreg.

[73] Assignee: Hewlett-Packard Company, Palo Alto, Calif.

[21] Appl. No.: 739,533

[22] Filed: Oct. 30, 1996

[51] Int. Cl.⁶ .................................. H02J 7/04; G06F 1/32
[52] U.S. Cl. ................................ 702/63; 702/64; 702/65; 702/60; 702/67; 395/750.01; 395/750.03; 395/750.06; 395/750.05
[58] Field of Search ..................................... 364/481, 483, 364/551.01, 570, 571.01; 320/30, 48, 43, 21, 31, 39, 40, 5, 32, 2, 20, 37; 324/426–427, 433, 429, 435; 340/636, 635; 307/66; 702/60, 63, 64, 65, 67; 395/750.01, 750.02, 750.03, 750.05, 750.06, 750.07, 750.08

[56] References Cited

U.S. PATENT DOCUMENTS

| | | | |
|---|---|---|---|
| 5,349,282 | 9/1994 | McClure | 320/136 |
| 5,382,839 | 1/1995 | Shinohara | 327/545 |
| 5,412,809 | 5/1995 | Tam et al. | 395/750.06 |
| 5,504,413 | 4/1996 | Fernandez et al. | 320/163 |
| 5,576,609 | 11/1996 | Brown et al. | 320/164 |
| 5,600,247 | 2/1997 | Matthews | 324/426 |

OTHER PUBLICATIONS

Andrieu et al., the abstract of "Circuit for measuring the state of charge of an electrochemmical cell", Journal of Power Sources, vol. 67, Issue 1–2, pp. 345–346, Sep. 8, 1997.

Myslinski et al., the abstract of "Method for displaying a charge level of a battery", Journal of Power Sources, vol. 66, Issue 1–2, p. 191, May 6, 1997.

Burroughs et al., the abstract of "Battery with strength indicator", Journal of Power Sources, vol. 63, Issue 2, p. 298, Dec. 1996.

Qualich et al., the abstract of "System and method for charging auxiliary batteries" Journal of Power Sources, vol. 63, Issue 2, p. 300, Dec. 1996.

Isoda, the abstract of "Charge controller for battery charger", Journal of Power Sources, vol. 63, Issue 2, p. 295, Dec. 1996.

Nobuo et al., the abstract of "Secondary battery charging circuit", Journal of Power Sources, vol. 63, Issue 2, p. 302, Dec. 1996.

Cameron, et al., the abstract of "Battery system and method for determining a battery condition", vol. 63, Issue 2, p. 302, Dec. 1996.

*Primary Examiner*—Emanuel Todd Voeltz
*Assistant Examiner*—Cuong H. Nguyen

[57] ABSTRACT

Battery current is indicated on a display element of a portable computing apparatus. Real time changes in battery current show the effects on the battery for given operations and configurations of the computing apparatus. The battery current is displayed as an icon. In various embodiments the icon indicates an absolute battery current value (e.g., in ampere or micro-ampere units), or a relative battery current value (e.g., a percentage relative to a predetermined reference current level). The icon appears on a display screen of the computing system or is a built-in dedicated indicator mounted into the apparatus case. A battery charge icon accompanies the battery current icon.

11 Claims, 3 Drawing Sheets

FIG. 2A  
2.5a
FIG. 2B  
84%
FIG. 2C
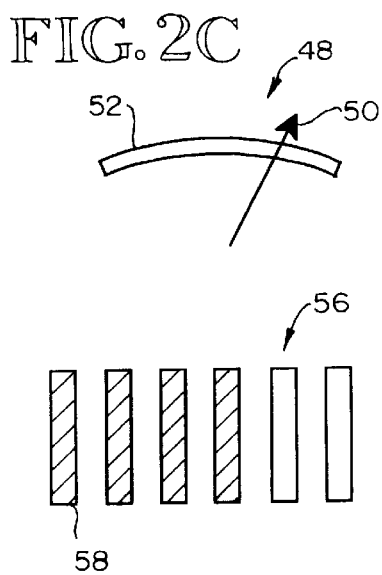
FIG. 2D
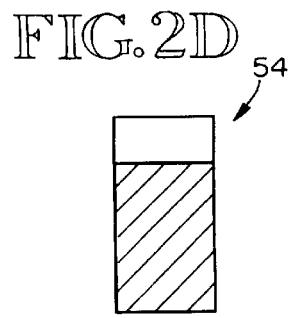
FIG. 2E
FIG. 3A
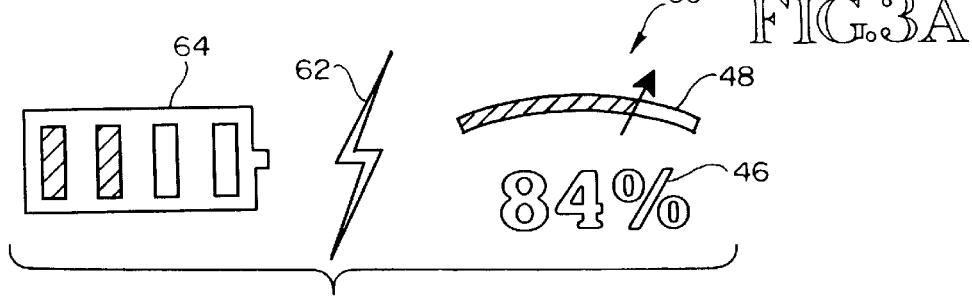
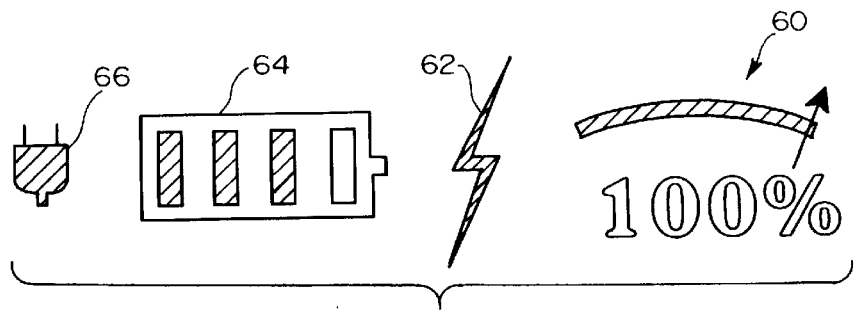
FIG. 3B

INDICATOR OF BATTERY CURRENT FOR PORTABLE DEVICES

BACKGROUND OF THE INVENTION

This invention relates generally to indicators of battery capacity parameters, and more particularly to indicators of battery capacity for lightweight and portable devices where awareness of remaining battery life is of concern.

Portable computing devices such as notebook computers, palm top computers, and hand held digital assistants typically include a battery-operated mode to enable operation while away from a power outlet. The size and weight of the batteries, however, limit the amount of battery power that one can carry and install within the computing device. Because these computing devices consume a significant amount of power relative to the amount stored in a battery, battery life is a concern to the user. Battery life typically is under 6 hours with the norm being under 3 hours.

A user needs to be aware of remaining battery capacity to prevent losing any work in process when the battery power gets too low to power component devices. Previously, notebook computers have included an LED battery charge indicator which turns on/off or flashes when the remaining power capacity gets below a threshold level. Alternative indicators include an icon appearing on a display screen. Windows 95, for example, allows a user to display a collection of status icons in the lower right corner of the display screen. Parameters such as voltage, current and battery temperature are measured to derive the battery charge indication.

The Hewlett Packard Omnibook 5500CT notebook computer includes a battery charge indicator built into the computer case. The indicator is in the form of a battery shaped icon. The battery icon includes multiple sections. Each section is fully lit when the battery is fully charged. As battery charge is reduced, each section in turn goes out. Multiple sections are included to distinguish between 0%, 25%, 50%, 75% and 100% of battery capacity. For the Windows 95 battery charge icon, when the battery is completely exhausted, a red circle with a line through it is overlayed onto the battery-shaped icon. To distinguish between when the battery is being charged versus drained, a lightening bolt appears next to the battery icon in some systems while the battery is charging.

While the battery charge icon provides important information to a computer user about the amount of charge left in the battery, it fails to give the user any indication of the rate at which this level of charge is being depleted. For example, a battery charge icon that indicates that a battery has 40% charge remaining may not be a matter of concern to a user that is depleting this level of charge at a slower rate, but may be a matter of great concern to a user that is depleting this level of charge at a faster rate and will have a dead battery before his work is completed. If the user only had some way of knowing the rate of discharge of his battery, he might be able to take specific steps (e.g. turn down the brightness on the display, unplugging his modem, etc.) to slow down the rate of discharge of his battery and allow his work to be completed before the battery dies. Without this knowledge, our hapless user is likely to have his battery die on him at most inopportune moments—over and over again.

SUMMARY OF THE INVENTION

According to the invention, an indicator of battery current is provided in addition to an indicator of battery charge. The battery current indicator provides more immediate information of real time operational effects on the battery. Specifically, battery current is a measure of the rate of change of battery charge over time, (i.e., $i=dQ/dt$, where 'i' equals battery current, 'Q' equals battery charge and 't' equals time). For example, when accessing a hard drive, the battery current will increase due to the increased current drain caused by the hard drive. When the access is over the battery current will go back down. A display of the rate of change in battery charge (i.e., battery current) provides battery information more closely related in time and effect to specific operations and configurations of the portable computing system.

According to one aspect of the invention, the battery current indicator is an icon of battery current. In various embodiments the icon indicates an absolute battery current value (e.g., amps, micro-amps), or a relative battery current value (e.g., a percentage relative to a determined reference current level). In one embodiment a gauge icon portion (e.g., resembling a speedometer) accompanies the battery current value. In another embodiment, the icon is a series of bars differentiating among different percentages of battery current (e.g., 20%, 40%, 60%, 80%, 100%, 120%). The icon appears on a display screen of the computing system or is a built-in dedicated indicator mounted in the system case. The display screen or built-in indicator are alternative embodiments of a display element for indicating battery current.

According to another aspect of the invention, a charging icon distinguishes whether the battery current icon relates to a battery current which is discharging (i.e., draining) or charging the battery.

According to another aspect of the invention, a reference value corresponding to a 100% battery current is predefined for a normal operating mode and a sleep or suspend mode.

According to another aspect of the invention, a reference value corresponding to a 100% battery current is predefined for alternative configurations of the system available to the user. The alternative configurations are defined according to which ports, expansion cards, or other devices, modules or components are enabled to receive power from the system battery. For a given configuration there is a rated 100% battery current determined for a given make and model of system and device/module/component corresponding to a given usage pattern, (e.g., a typical heavy usage pattern). Percentages above 100% also are possible. In addition, respective 100% reference values are assigned for a battery charging operation and a suspend mode of the portable computer system.

An advantage of such a battery current indicator is that a user can see the immediate effect of specific actions and configurations on battery life. For example, a user can see a difference in battery current when adjusting the brightness of a display panel. By turning down the brightness, the current drain reduces and thus the battery current decreases. The longer term effect is an increase in battery life between recharges. A user can train themselves to efficiently configure the portable computing system to increase battery life. The user is more able to perceive the benefits of turning down display brightness, turning off power to a modem card or other PC card when not in use and other power saving adjustments. Further, the user is more able to perceive which applications drive the system to consume more power.

These and other aspects and advantages of the invention will be better understood by reference to the following detailed description taken in conjunction with the accompanying drawings.

BRIEF DESCRIPTION OF THE DRAWINGS

FIGS. 2A–2E are diagrams of alternative embodiments of a battery current icon for indicating battery current;

FIGS. 3A and 3B are diagrams of battery indicator icons for indicating battery information according to an embodiment of this invention;

DESCRIPTION OF SPECIFIC EMBODIMENTS

Overview

Figure 1:
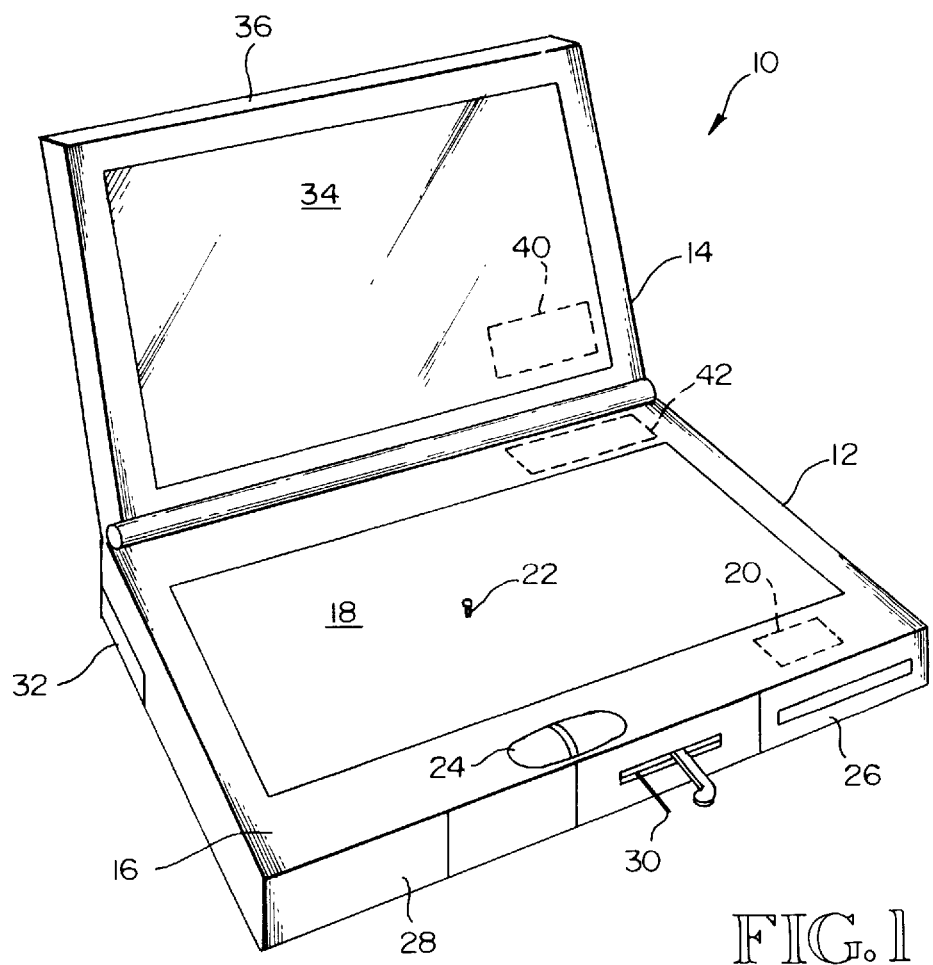
FIG. 1 is a perspective view of a portable computing apparatus having a battery current indicator according to an embodiment of this invention.

FIG. 1 shows a perspective view of a portable computing system 10 according to an embodiment of this invention. The computer 10 includes a system unit 12 and a display unit 14. The system unit 12 includes a housing 16, keyboard 18, and processor 20. In some embodiments the system unit 12 also includes a pointing device 22 (e.g., mouse, trackball, touchpad, eraser head), clicking device 24, a floppy disk drive 26, a hard disk drive 28, fax/modem 30 (or other PC card) and a battery 32. The display unit 14 includes a display panel 34 and a display housing 36. The computer 10 embodies a proprietary work station, personal computer, PENTIUM computer, APPLE MACINTOSH computer, or other computer currently available or to come based on the Intel 80X86 architecture, Motorola 68XXX architecture, PowerPC architecture or other CISC processor architectures, RISC processor architectures and other single or multiple multiprocessor architectures. Illustrated in FIG. 1 is a portable computer in a notebook computer case. Alternative embodiments include laptop computers, palmtop computer, hand-held computers, and personal digital assistant devices. In still other alternative embodiments, the computer 10 embodies simpler architectures for hand-held computing devices or INTERNET communication devices.

The portable computing system 10 includes a display element 40/42 for indicating battery information. In one embodiment the display element 40 is a portion of the display screen 34 upon which battery information is displayed. The display screen is an LCD panel, plasma display panel, or other display panel. Such portion includes all or a subset of the display screen 34. In the embodiment illustrated the lower right portion of the display screen 34 displays the battery information. The lower right portion is either dedicated to displaying battery information or is set to display the desired information by the user. The lower right portion displays the battery information for a prescribed or indefinite period of time. The battery information is displayed upon user request, is displayed periodically, or is displayed aperiodically.

In an alternative embodiment the display element 42 is a dedicated element built into the system unit housing 16. The display element 42 is formed by one or more LCD elements, a small LCD panel, a set of light emitting diodes ('LEDs') or other display structure. In some embodiments a background for light emitting portions of the display element 42 is formed in the housing 16.

Battery Current Icons

The display element 40/42 display a battery current icon for indicating the rate of change in battery charge. FIGS. 2A–2E show alternative embodiments of a battery current icon according to this invention. FIG. 2A depicts a numeric icon 44 of battery current in absolute terms (with or without polarity indication). The icon 44 appears as a numeric value with ampere units. Alternative units are used in a different embodiment. FIG. 2B depicts a numeric icon 46 of battery current in relative terms (with or without polarity indication). The icon 46 appears as a numeric percentage. The displayed value is a percentage value of battery current relative to a predefined reference current value. FIG. 2C depicts an icon 48 in the form of a dial. The dial icon 48 includes a pointer 50 which moves along a dial 52 between a lowest value and a highest value. The location of the pointer 50 relative to the dial 52 is determined by the value of the measured battery current relative to the lowest value and highest value. Such dial icon 48 depicts absolute battery current or relative battery current according to the embodiment. For example, the lowest value is a 0% value and the highest value is a 100% value of battery current. Alternatively, the lowest value and highest value each correspond to respective absolute current values.

FIG. 2D depicts another icon 54 in the form of a gauge. In the embodiment illustrated the gauge icon 54 is a vertically erect rectangle depicting a scale. At full scale the entire contents of the rectangle are lit/colored. At zero scale none of the contents of the rectangle are lit/colored. At zero scale, merely the outline of the rectangle appears. A portion of the rectangle is lit/colored to depict scaled battery current values between the zero level and full scale level. According to different embodiments, the gauge icon differentiates between percentage intervals (e.g., 0%, 10%, 20%, . . . 100%). In some embodiments the scale includes a 100% level and additional levels above a 00% level. The 100% level corresponds to a predefined battery current value and the various percentages are determined relative to such predefined value.

FIG. 2E depicts yet another icon 56 in the form of multiple adjacent light segments 58. When none of the segments 58 are lit the battery current level is within a first range (e.g., 0% to <10% of a predefined reference battery current). When one segment 58 (e.g., the left most segment) is lit, the measured battery current is within a second range (e.g., 10% to <30% relative to the predefined reference battery current). When two segments 58 (e.g., the two left most segments) are lit, the measured battery current is within a third range (e.g., 30% to <50% relative to the predefined reference battery current). When three segments 58 (e.g., the three left most segment) are lit, the measured battery current is within a third range (e.g., 50% to <70% relative to the predefined reference battery current). When four segments 58 (e.g., the four left most segments) are lit, the measured battery current is within a fourth range (e.g., 70% to <90% relative to the predefined reference battery current). When five segments 58 (e.g., the five left most segments) are lit, the measured battery current is within a fifth range (e.g., 90% to <110% relative to the predefined reference battery current). When all six segments 58 are lit, the measured battery current is above the fifth range (e.g., ≧110% relative to the predefined reference battery current). The number of segments 58 and the percentage interval corresponding to each segment may vary. Thus, although 6 segments 58 are depicted with each segment corresponding to a 20% interval, fewer or more segments representing a smaller or larger interval are included in alternative embodiments.

An other alternative embodiments, battery charge is displayed using a combination of icons 44, 46, 48, 54, 56. In FIGS. 3A and 3B, for example, the percentage icon 46 and dial icon 48 are combined to form an alternative battery current icon 60.

To distinguish between times when the portable computing system battery is discharging from times when it is charging, a charging icon 62 also is included in some embodiments. FIGS. 3a and 3b show a conventional battery charge icon 64 with the charging icon 62 and the combined battery current icon 60. The battery charge icon 64 indicates the amount of battery charge remaining in the battery. In FIG. 3B approximately 50% of the battery charge remains. In FIG. 3B approximately 75% of the battery charge remains. In FIG. 3A the charging icon is represented as merely an outline of a lightening bolt. Such outline indicates that the battery is discharging. Alternatively, the charging icon 62 does not appear while the battery is discharging. In alternative embodiments the charging icon takes on a different shape. In still other embodiments, the battery charge and/or battery current icons appear in a different color or use another mode of distinguishing charging from discharging time periods. FIG. 3B also shows a power plug icon 66 indicating that an AC power adapter is plugged in. Also note that the charging icon 62 is lit indicating that the battery is receiving charge. The battery current icon 60 displays a 100% value indicating that a predefined current level is flowing into the battery to charge the battery. Such 100% alternatively appears as a −100% to indicate polarity and differentiate charging and discharging in an alternative embodiment (not shown). Typically, the battery current would be at 100% during charging. However, when the user operates the computer 10 during the charging cycle, a portion of the current supplied from a power outlet via an AC adapter is diverted from the battery charging to power the computer 10 operations. Thus, the battery current appears as being less than 100% (not shown).

Battery Current Sensing

Figure 4:
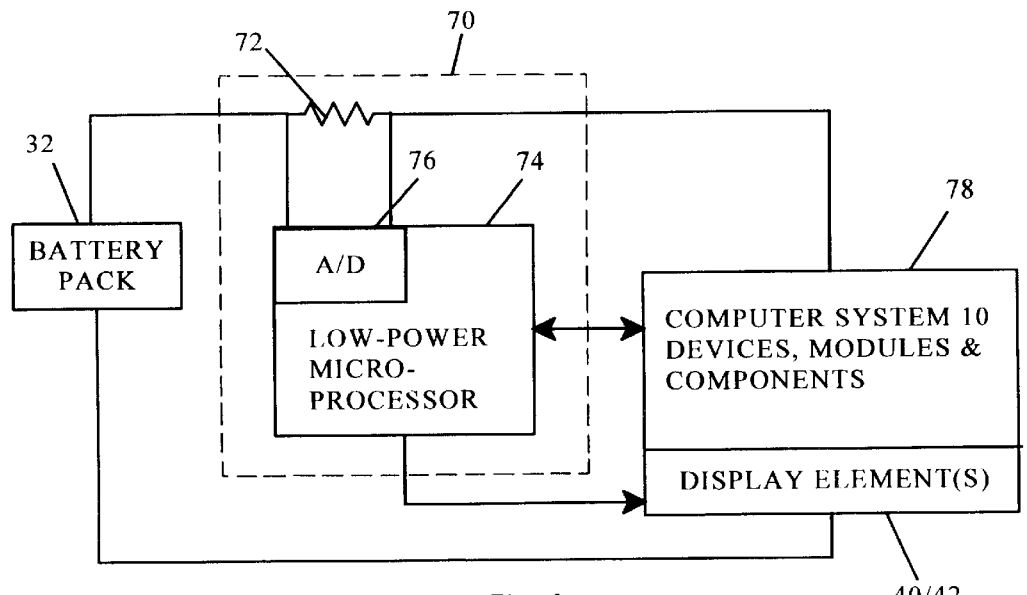
FIG. 4 is a block diagram of a computer system with a battery current sensing circuit.

FIG. 4 shows a circuit 70 for measuring battery current from the battery 32 installed in the portable computing system 10. The circuit 70 includes a resistor 72 in series with the battery 32. In one embodiment the resistor is a 0.1 ohm resistor. Current across the resistor 72 is measured by a low power microprocessor 74. In one embodiment the microprocessor 74 is the HD64F3434TF 16 8-bit microprocessor from Hitachi America, Ltd. of Brisbane, Calif. The microprocessor 74 includes an analog to digital converter which measures voltage drop across the resistor. Current flows from the battery 32 through the resistor 72 causing a voltage drop across the resistor 72 which is proportional to the current flowing across the resistor 72 and across the wires of the A/D converter 76. The microprocessor 74 records the voltage readings. With the resistance and voltage drop known the microprocessor 74 is able to derive current. By using a resistor having low resistance, such calculated current corresponds to the battery current. Such derived battery current is used to define a battery current indication to be shown on the display element 40/42.

Current flows from the battery 32, through the resistor 72, then into other devices, modules and components of the portable computing system 10 as indicated by block 78 in FIG. 4. In one embodiment the low power microprocessor 74 is the central processing unit 20 of the computer system 10. The actual battery current measured at any given time depends upon the power being drawn by the computer system devices, modules and components powered by the battery 32. Because supply voltage is regulated and held generally constant, the current increases as more devices, modules or components perform power consuming functions. Different devices, modules and components also consume differing amounts of power depending on the operation or mode. For example, a computer display panel 34 requires more power (and thus draws a larger current) as brightness is turned up. A hard drive 28 consumes more power when spinning up the hard disk, compared to when the hard disk is spun down to a stationary position. Adding a PC card such as a fax/modem 30 (see FIG. 1) into a PC card slot causes more power to be drawn when power to a port serving such card is turned on.

Method for Determining Displayed Battery Current Value

Figure 5:
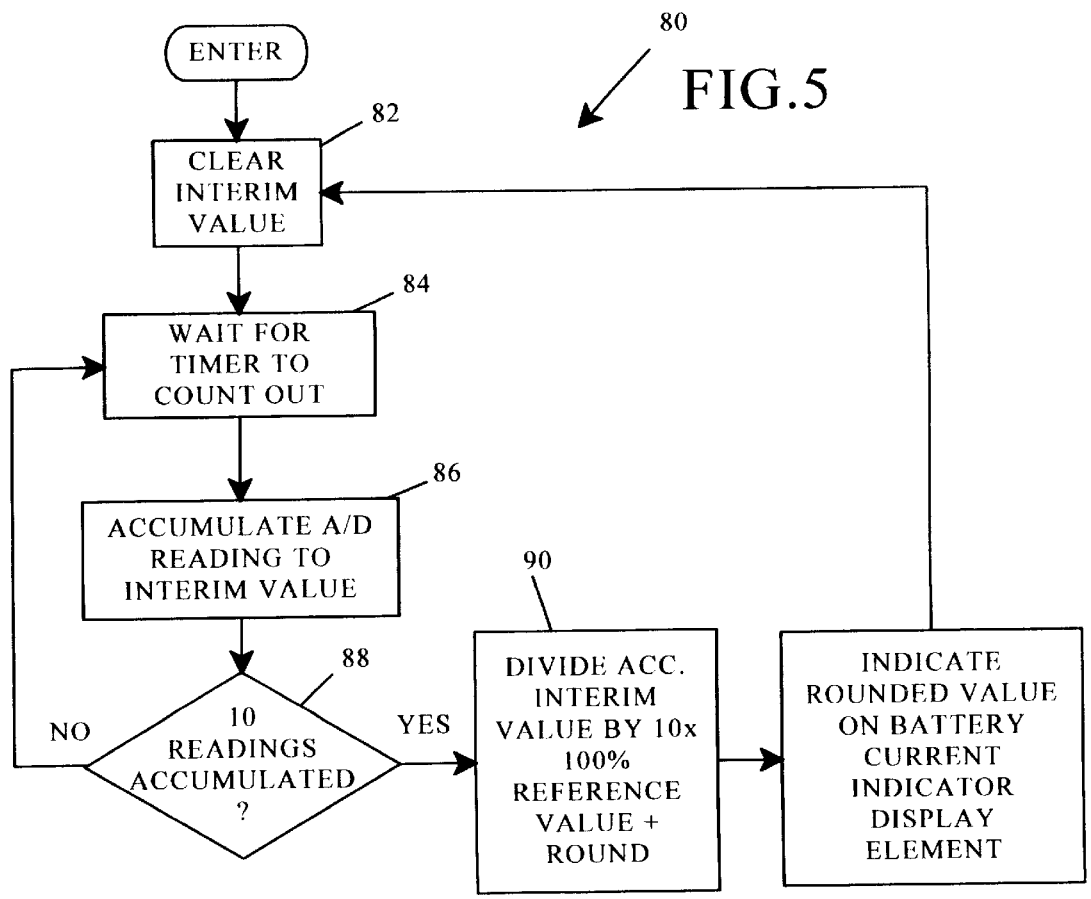
FIG. 5 is a flow chart of a computer program for controlling the battery current monitoring process according to an embodiment of this invention.

FIG. 5 shows a flow chart of a software routine 80 performed by the microprocessor 74 according to one embodiment of this invention. The routine 80 accumulates several measures of battery current over a prescribed time period, then averages the battery current to define a measured battery current value. The prescribed time period is short enough to cause the measured battery current to differentiate among differing system loads, but not so short as to change the displayed battery current so often that the user can not read the displayed value. In one embodiment the battery current display indication is updated once per second. In other embodiments the update period is shorter or longer.

Referring to FIG. 5 at step 82 a stored value for battery current is cleared. At step 84 processing waits for a timer to time out. This ensures that a measurement is taken at not less than a prescribed interval of time (e.g., 0.1 seconds). At step 86 the battery current across the resistor 72 is measured (e.g., voltage drop is measured and converted to current). This value is added to the stored value to accumulate a battery current value. At step 88, the number of repetitions is tested to determine whether a prescribed number (e.g., 10) of readings have occurred. If not, then the routine 80 loops to step 84 and waits for the timer to time out again. Once timed out, the next battery current measure is taken and added to the stored value. Once the prescribed number of measures has been taken routine 80 branches to step 90 where the accumulated battery current value is divided by the prescribed number of repetitions to achieve an average battery current value. For embodiments in which the absolute battery current is displayed (e.g., icons 44 or 48) such average value either is displayed directly (e.g., icon 44), or is scaled to a battery current indicator scale (e.g., icon 48). For embodiments in which battery current is depicted relative to a prescribed battery current reference value, the average battery current is divided by the 100% reference value to achieve a relative battery current as a percentage. The relative battery current is displayed in numeric format as icon 46. In alternative embodiments the relative battery current is used to derive a relative indicator such as the location of pointer 50 in icons 48 or 60, or the portion lit/colored in icon 54 or the number of sectors lit/colored in icon 56. At step 90 rounding is performed to round to the nearest display interval (e.g., sector in icon 56, area in icon 54, pointer location interval in icon 48, numeric value in icon 46, 60). In some embodiments the absolute battery current is displayed to a prescribed precision. Similarly, the relative battery current is displayed to a prescribed precision. The units of precision may vary. For example, one manner of preventing the battery current indicator from changing too often is to use a large interval for the precision units (e.g., 20% intervals).

Reference Battery Current Value

The 100% battery current level is a prescribed level selected according to a given usage pattern anticipated by a manufacturer. For example, during operation of a notebook computer battery current drain is normally in the range of 2–3 amperes depending the current operation and configuration of the system. By setting the 100% value to 2.5 amperes, the user sees which operations and configurations tax the power source most. More importantly the user can perceive the battery drain from different operations and configurations and make adjusts to the configuration or their behavior to reduce the drainage and thus prolong battery life between recharging or replacement of the battery 32.

In one preferred embodiment the 100% reference level is prescribed and remains constant regardless of the mode, operation or configuration of the computing system 10. In another preferred embodiment, the specific 100% reference level changes when the computer goes into a sleep mode in which power is turned off or down to certain devices, components and/or modules. During such sleep mode the battery current typically goes down from the ampere level to the micro-ampere level. If the battery indicator icon is to have meaning (e.g., display other than 0 amps or 0%), then the units, scale or 100% reference value is to be changed. Accordingly, when software is executed to put the computing device 10 into a sleep or suspend mode the scale, units or 100% reference value, as appropriate for the embodiment, is changed. Similarly, when the computer comes out of sleep mode or suspend mode the scale, units or 100% reference value revert back to the normal scale, units or value.

In still another embodiment the scale or 100% reference value is changed according to the given configuration of the computing system 10. The configuration corresponds to the hardware configuration of devices, modules and components installed and enabled to receive power. A fax modem port for example can be turned on or off to change the configuration. A display screen can put to 'sleep' to change the configuration. A hard disk drive can be spun down to change the configuration. A different 100% reference value is prescribed for each configuration. Some users may prefer a common scale regardless of the configuration and thus in some embodiments changing the 100% reference value is omitted, while in other embodiments the value changes only when switching between sleep mode or suspend mode and the normal operating mode.

Meritorious and Advantageous Effects

During ongoing operations of the computing system 10 battery current level is indicated and updated via the icon (44, 46, 48, 54, 56, 60). For a given operation, battery current level is indicated before the operation, during the operation and after the operation. The battery current indication indicates an increase in battery current drain during performance of the operation and a decrease in battery current drain following completion of the operation. The computer system 10 also is reconfigurable. Different configurations draw different amounts of battery current. Battery current level is indicated before the change in configuration and after the change in configuration. The battery current indication typically changes after the configuration change because of different current needs attributable to the changed configuration.

An advantage of the battery current indicator of this invention is that a user can see the immediate effect of specific actions and configurations on battery life. For example, a user can see a difference in battery current when adjusting the brightness of a display panel. By turning down the brightness, the current drain reduces and thus the battery current decreases. The longer term effect is an increase in battery life between recharges. A user can train themselves to efficiently configure the portable computing system to increase battery life. The user is more able to perceive the benefits of turning down display brightness, turning off power to a modem card or other PC card when not in use and other power saving adjustments. Further, the user is more able to perceive which applications drive the system to consume more power.

Although a preferred embodiment of the invention has been illustrated and described, various alternatives, modifications and equivalents may be used. Therefore, the foregoing description should not be taken as limiting the scope of the inventions which are defined by the appended claims.

What is claimed is:

1. A portable computing apparatus, comprising:

a system unit having a processor:

a display element;

a battery supplying power to the system unit and display element;

a circuit for determining battery current;

wherein the display element activates a battery current icon which indicates battery current level based upon the measured current, wherein the indicated battery current level increases and decreases during battery discharge.

2. The apparatus of claim 1, in which the battery current icon operates in a mode during charging of the battery and a second mode during discharging and discharging of the battery.

3. The apparatus of claim 1, in which the indicted battery current level is a relative level of battery current.

4. A method for indicating state of a battery powering a portable computing apparatus, comprising the steps of:

measuring output voltage of the battery;

determining battery current;

displaying an indication of battery charge level;

displaying an indication of battery current level as a value relative to a reference battery current level determined for a first configuration of the portable computing apparatus, wherein the indication of battery current level is distinct from the indication of battery charge level, wherein the indication of battery current level increases and decreases during battery discharge;

changing the reference battery current level for a second configuration of the portable computing apparatus; and repeating the steps of measuring, determining, displaying the indication of battery charge level and displaying the indication of battery current level after the step of changing.

5. A method for displaying battery current levels of a battery powering a portable computing device, comprising the steps of:

measuring battery current;

displaying measured battery current relative to a reference current level corresponding to a first mode of operation of the computer;

changing the operating mode of the portable computing apparatus to a sleep mode, which differs from the first mode;

changing the reference battery current level to a value corresponding to the sleep mode;

after the steps of changing the operating mode and changing the reference battery current level, remeasuring battery current; and after the step of remeasuring, displaying battery current relative to the value for the reference current level corresponding to the sleep mode.

6. A method for indicating state of a battery powering a portable computing apparatus, comprising the steps of:

measuring output voltage of the battery;

determining battery current;

displaying an indication of battery charge level; and displaying an indication of battery current level distinct from the indication of battery charge level, wherein the indication of battery current level increases and decreases during battery discharge.

7. The method of claim 6, further comprising the steps of:

distinguishing battery current during charging of the battery and discharging of the battery.

8. The method of claim 6, in which the indication of battery current level is an indication of battery current relative to a prescribed battery current level.

9. A method for displaying battery current levels of a battery powering a portable computing device, comprising the steps of:

measuring battery current;

determining mode of the portable computing apparatus;

determining a reference battery current level corresponding to the mode; and displaying measured battery current relative to the reference current level.

10. A method for indicating rate of battery discharge during a battery discharge cycle of a battery powering a portable computing device, the method comprising the steps of:

determining battery current;

displaying an indication of the battery current;

performing a first operation by the portable computing apparatus;

redetermining battery current during performance of the first operation;

updating an indication of battery current during the performance of said first operation;

redetermining battery current after the step of performing; and re-updating the indication of battery current after the step of performing, wherein the battery current indication indicates an increase in battery current drain during performance of the first operation and a decrease in battery current drain following completion of the first operation.

11. The method of claim 10, further comprising, after the step of displaying, the steps of:

changing configuration of the computer system;

redetermining battery current after changing the configuration;

updating the indication of battery current after changing the configuration, wherein the battery current indication changes after the configuration is changed, and wherein the change in battery current indication is attributable at least in part to the change in configuration.

* * * * *